United States Patent
Su et al.

(10) Patent No.: US 6,677,779 B1
(45) Date of Patent: Jan. 13, 2004

(54) FLEXIBLE CONTROL INTERFACE FOR INTEGRATED CIRCUIT

(75) Inventors: David Kuochieh Su, Mountain View, CA (US); Masoud Zargari, Cupertino, CA (US); Lars E. Thon, San Jose, CA (US); William J. McFarland, Los Altos, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 10/113,806

(22) Filed: Mar. 28, 2002

Related U.S. Application Data

(60) Provisional application No. 60/283,101, filed on Mar. 29, 2001.

(51) Int. Cl.[7] .............................................. H03K 19/177
(52) U.S. Cl. ........................................... 326/38; 326/82
(58) Field of Search .............................. 326/37, 38, 82, 326/83, 89; 710/2, 3

(56) References Cited

U.S. PATENT DOCUMENTS

| | | | |
|---|---|---|---|
| 4,935,737 A | * 6/1990 | Izbicki et al. | 326/39 |
| 6,288,569 B1 | * 9/2001 | Wittig et al. | 326/41 |
| 6,509,758 B2 | * 1/2003 | Piasecki et al. | 326/37 |
| 2003/0071653 A1 | * 4/2003 | Carberry et al. | 326/40 |

* cited by examiner

*Primary Examiner*—Don Le
(74) *Attorney, Agent, or Firm*—Bever, Hoffman & Harms, LLP; Jeanette S. Harms

(57) ABSTRACT

A control interface, which includes both master and slave devices, can provide buffering of input data packets, thereby allowing configurations of the integrated circuit to be modified quickly and efficiently. Additionally, the control interface can be sized and configured to receive digital signals from any number of nodes on an integrated circuit, thereby facilitating the testing, lab characterization, and debugging of those nodes. Finally, the control interface can advatageously control the monitoring of analog components on the integrated circuit, thereby significantly reducing the number of pins for such monitoring. The control interface has particular relevance to highly integrated circuits that utilize analog and/or mixed signals.

51 Claims, 6 Drawing Sheets

FLEXIBLE CONTROL INTERFACE FOR INTEGRATED CIRCUIT

This application claims priority to U.S. provisional application serial No. 60/283,101, filed Mar. 29, 2001 entitled "Method And System For Analog-Digital Control And Interface Therefor".

BACKGROUND OF THE INVENTION

1. Field of the Invention

The invention relates to an interface for an integrated circuit and particularly to a control interface that can allow variable length input data streams, provide a buffering function, and facilitate monitoring of both digital and analog signals.

2. Description of the Related Art

The functionality and monitoring of an integrated circuit can be significantly limited by the number of pins on the integrated circuit. In fact, this problem has forced some systems to resort to providing discrete integrated circuits for various critical functions. These discrete integrated circuits increase the system's ability to monitor such functions, but undesirably increase both the size and cost of the system.

Thus, integrated circuits have continued to integrate additional functionality without having a commensurate capability to monitor such additional functionality. To solve this problem, some integrated circuits include control circuitry in a limited, predetermined area of the chip and use thousands of lines to detect conditions in or provide signals to other areas of the chip. However, these lines can create significant challenges in routing and undesirably increase the size of the integrated circuit.

In a purely digital device, controllability and observability can be provided using the 1999 IEEE 1149.1 standard, also called boundary-scan, which was promulgated by the the Joint Test Action Group (JTAG). This standard defines a set of design rules that allow virtual access to nodes in an integrated circuit during its debugging and production test. However, boundary scan is not adequate for highly integrated systems that include analog and/or mixed signal (i.e. both analog and digital) integrated circuits. Moreover, during the normal operation mode, boundary-scan is inactive and thus cannot facilitate monitoring or changing the functionality of the integrated circuit.

Some integrated circuits include large shift registers to change their functionality, wherein new configurations for the integrated circuits can be theoretically loaded when needed. However, many systems cannot interrupt normal operation for the time needed to load these large shift registers. Thus, in these systems, configuration of such integrated circuits is typically limited to a power up operation.

Therefore, a need arises for a system and method of monitoring highly integrated circuits as well as allowing the re-configuration of such integrated circuits.

SUMMARY OF THE INVENTION

In accordance with one feature of the invention, a control interface of an integrated circuit can provide buffering of input data packets, thereby allowing configurations of the integrated circuit to be modified quickly and efficiently. Moreover, the control interface can be sized and configured to monitor digital signals from any number of nodes on an integrated circuit, thereby facilitating the testing, lab characterization, and debugging of those nodes. Finally, the control interface can advatageously control the monitoring of analog components on the integrated circuit, thereby significantly reducing the number of pins for such monitoring. The control interface has particular relevance to highly integrated circuits, such as radio transceivers, which can have extremely demanding requirements when interfacing to other integrated circuits, e.g. broadband devices.

The control interface includes a plurality of buffer registers for receiving the input data packet. The control interface further includes a plurality of control registers, wherein each control register can be loaded from its associated buffer register. The control registers are coupled in operative relation to functional blocks on the integrated circuit. These functional blocks can perform various functions, which can utilize analog and/or mixed (i.e. a combination of analog and digital) signals. In one embodiment, the plurality of buffer registers are coupled to input pins of the integrated circuit.

In accordance with one feature of the invention, the buffer registers can have different lengths. However, a control register has the same length as its associated buffer register. Thus, a buffer/control register can be characterized as a "long" or "short" register. A short register can include N or less flip-flops and a long register includes more than N flip-flops. In one embodiment, N is approximately 6.

In one embodiment, the integrated circuit can implement a radio transceiver. In this embodiment, the short buffer registers can be used to load dynamically adjustable control values and the long buffer registers can be used to load static configuration control values.

The integrated circuit can further include an analog line coupled to a pin of the integrated circuit. Multiple analog components on the integrated circuit can be selectively coupled to the analog line using corresponding digital switches. The control interface can advantageously configure and/or set one or more function blocks to control these switches. In this manner, the control interface minimizes the number of pins necessary to access parameters associated with each analog component.

The control interface can further include a multiplexer that receives signals provided by the plurality of buffer registers and the plurality of control registers. The multiplexer can also receive one or more user data signals on the integrated circuit. Therefore, the control interface advantageously allows access to many digital nodes in the integrated circuit, thereby facilitating the testing, lab characterization, and debugging of those nodes. In one embodiment, the multiplexer is coupled to an output pin of the integrated circuit.

A method of providing an interface on an integrated circuit is described. The method includes buffering a data packet received by pins on the integrated circuit. The buffering can be performed by a plurality of buffer register sets. The data packet can be selectively transferred from one of buffer register sets into a designated control register set. The designated control register set can configure and/or control a functional block on the integrated circuit. Because the data packet is buffered, these values can be transferred without interrupting operation of the functional block. The control interface can also allow access to content stored by each buffer and control register, thereby facilitating testing and calibration of many nodes in the integrated circuit.

In accordance with one feature of the invention, the buffer registers can have different lengths. The buffer registers can be organized into buffer register sets (with corresponding control register sets). The buffer register sets receive the same data packet. However, each buffer register in the set receives a different data stream, wherein all the data streams form the data packet. In one embodiment, the buffer registers can receive data streams of different lengths. If the length of a buffer register is shorter than its received data stream, then a data overflow condition occurs.

In accordance with another feature of the invention, an address is appended to the end of one of the data streams. The control interface can include an address decoder to decode the address and determine which control register set will receive the data packet. In other words, although all buffer register sets receive the data packet, only one control register set receives the transferred data packet. The buffer register sets not loading the designated control register set are considered "don't care" sets. Overflow conditions can occur in the don't care sets. The buffer register set loading the designated control register set (called an active buffer register set) is typically sized for its received data stream. Therefore, an overflow condition typically does not occur in the active buffer register set. In one embodiment, some buffer registers load dynamically adjustable control values and other buffer registers load static configuration control values.

A method of transfering data to an integrated circuit is also provided. The method includes assessing the length of a data packet to be transferred, wherein the data packet includes a first bit and a last bit. Bits representing an address for the data packet can be appended after the last bit of the data packet. The data packet and the appended bits can then be transferred to the integrated circuit. The appended bits can be decoded to identify the address. At this point, the data packet can be loaded into a control register set identified by the address. The data packet can include a plurality of data streams, wherein each data stream can be three to N bits in length, wherein N is an integer. The method can further include buffering the data packet.

DETAILED DESCRIPTION OF THE FIGURES

In accordance with one feature of the invention, a control interface can provide fast data transfer and data buffering for operations being performed on the integrated circuit. Moreover, the control interface can allow the testing and calibration of certain parameters in the integrated circuit. The components, methodologies, and advantages associated with this control interface will now be described in detail.

Figure 1:
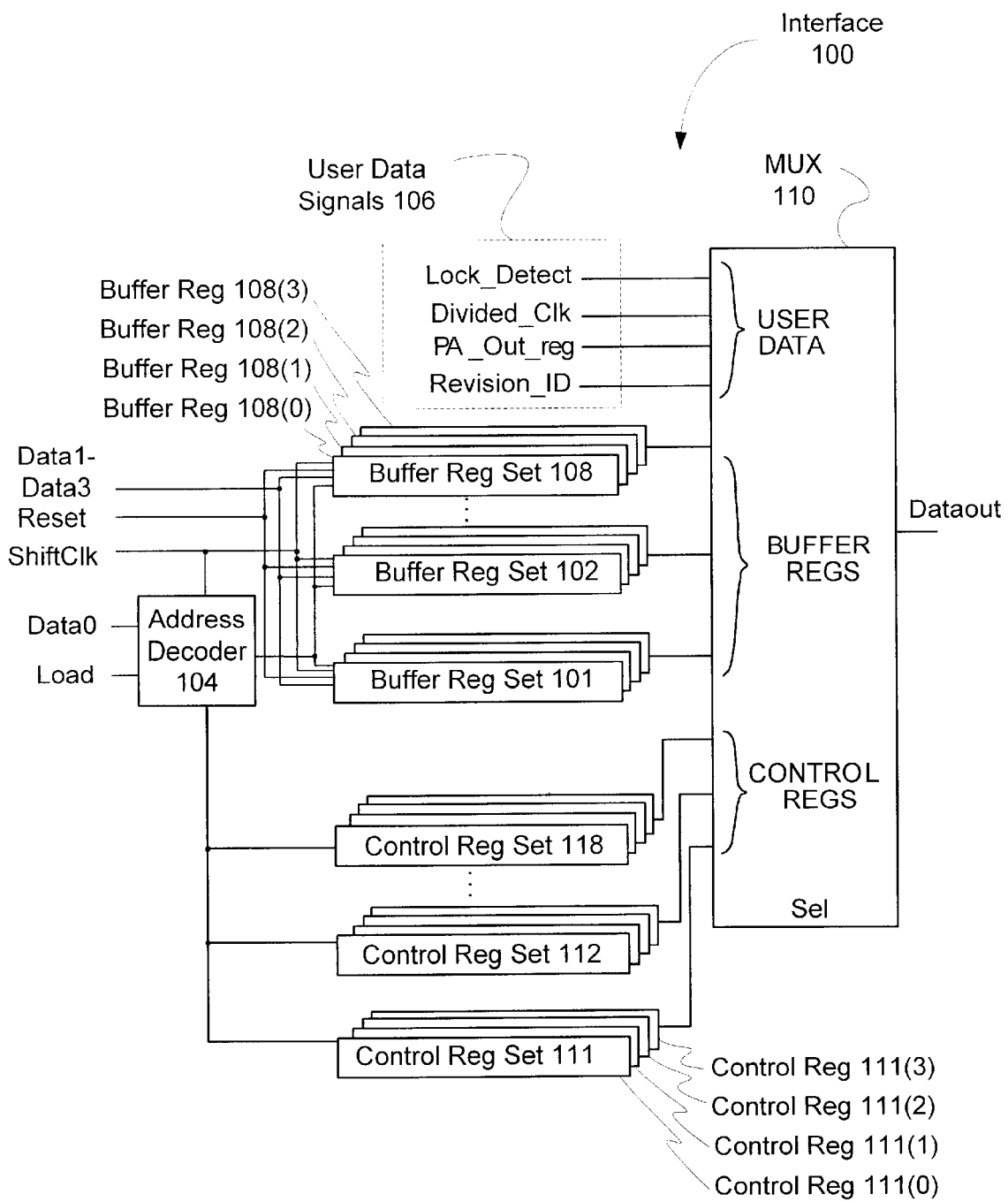
FIG. 1 illustrates a simplified control interface for an integrated circuit in accordance with one embodiment of the invention.

FIG. 1 illustrates one embodiment of a control interface 100 for an integrated circuit. In accordance with one feature of the invention, control interface 100 minimizes pin count while maximizing the number of accessible nodes in the integrated circuit. In this embodiment, control interface 100 is connected to seven input pins (i.e. pins that provide signals Data0–Data3, ShiftClk, Load, and Reset) and one output pin (i.e. a pin that provides the signal Dataout). Therefore, in this embodiment, control interface 100 is connected to eight pins of the integrated circuit.

To maximize node accessibility on the IC, control interface 100 includes a large multiplexer 110, which can receive signals from a plurality of buffer register sets as well as a corresponding plurality of control register sets. For example, in the embodiment shown in FIG. 1, buffer register sets 101–108 have corresponding control register sets 111–118, respectively.

Multiple data lines can be provided to increase the amount of data that can be loaded into the IC while maintaining the low pin count. In accordance with one feature of the invention, the the number of registers in each register set corresponds to number of data lines. In control interface 100, four data lines are provided and therefore each register set includes four registers. For example, buffer register set 108 includes buffer registers 108(0)–108(3) and control register 111 includes control registers 111(0)–111(3).

Buffer register sets 101–108 receive an input data packet including data streams Data1–Data3 and selectively transfer that data packet to one of control register sets 111–118. In accordance with one feature of the invention, each buffer register in a buffer register set receives one of data streams Data0–Data3. For example, in FIG. 1, buffer register 108(0) could receive data stream Data0, buffer register 108(1) could receive data stream Data1, buffer register 108(2) could receive data stream Data2, and buffer register 108(3) could receive data stream Data3. The buffer registers of the other buffer register sets 101–107 could receive data streams Data0–Data3 in a similar manner.

Figure 2A:
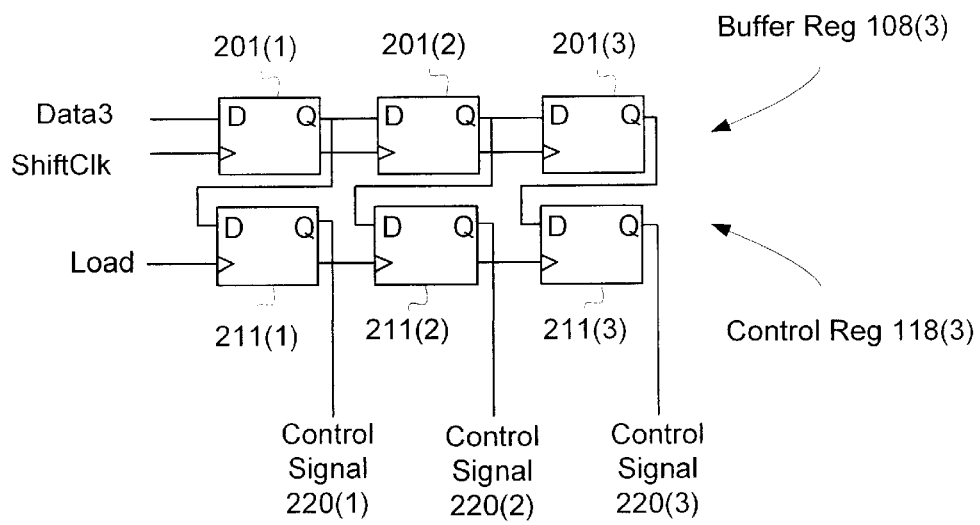
FIG. 2A illustrates the connection of one buffer register and its corresponding control register.

FIG. 2A illustrates the coupling of a buffer register to its corresponding control register to facilitate a time-efficient transfer of data. Specifically, in this embodiment, buffer register 108(3) of buffer register set 108 (FIG. 1) includes 3 flip-flops 201(1)–210(3) connected serially, i.e. the Q output terminals of flip-flops 201(1) and 201(2) are connected to the D input terminals of flip-flops 202(2) and 202(3), respectively. Flip-flop 201(1) receives a data signal Data3 and passes this signal to flip-flop 202(2) at an edge (generally the rising edge) of clock signal ShiftClk. In turn, flip-flop 201(2) passes the Datax signal to flip-flop 201(3) at the next edge of clock signal ShiftClk.

In accordance with one feature of the invention, the control register that corresponds to a buffer register includes the same number of flip-flops, i.e. the registers have the same length. Thus, for example, control register 118(3), which corresponds to buffer register 108(3), also has 3 flip-flops 211(1)–211(3). As shown in FIG. 2A, the Q output terminals of buffer register 108(3) are further connected to the D input terminals of control register 118(3). Specifically, the Q output terminal of flip-flop 201(1) is connected to the D input terminal of flip-flop 211(1), the Q output terminal of flip-flop 201(2) is connected to the D input terminal of flip-flop 211(2), and the Q output terminal of flip-flop 201(3) is connected to the D input terminal of flip-flop 211(3). The Q output terminals of flip-flops 211(1)–211(3) provide control signals 220(1)–220(3), respectively. These control signals can configure a function block, or portion thereof, in the integrated circuit for its normal operation.

As shown in FIG. 2A, the signals on the Q output terminals of flip-flops 211(1)–211(3) do not change until an edge of a load signal Load is received, thereby loading the values stored in buffer register 108(3) into control register 118(3). Thus, the buffering provided by buffer register 108(3) can advantageously minimize the transition time between states of the function block configured by control signals 220–223. In other words, the switch from one operational state to another operational state can be advantageously done within the time it takes for the signals on the D input terminals of flip-flops 211 to be transferred to their Q output terminals.

Figure 2B:
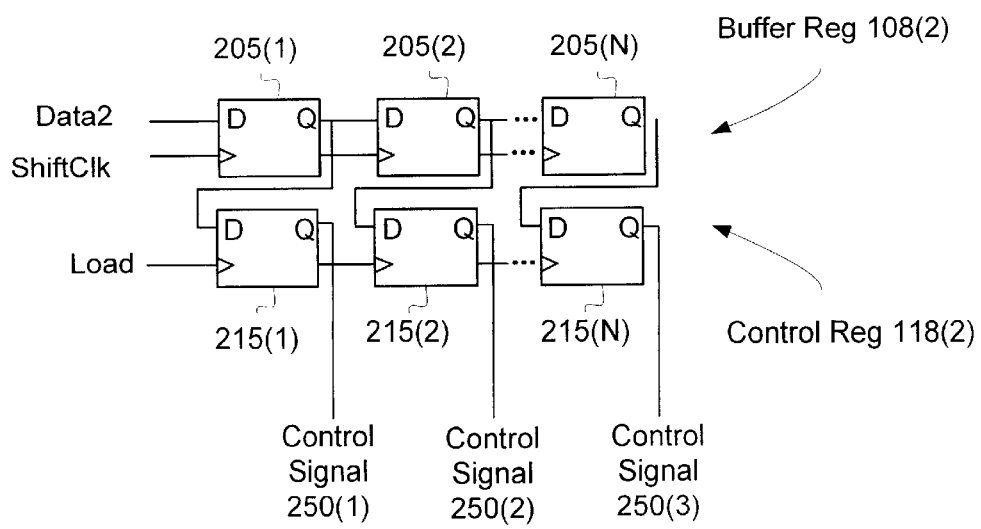
FIG. 2B illustrates the connection of another buffer register and its corresponding control register.

In accordance with one feature of the invention, the number of flip-flops of a buffer register and its corresponding control register are the same. However, the number of flip-flops within the register can vary, both between register sets and within the same register set. For example, FIG. 2B illustrates a buffer register 108(2), which could be in the same buffer register set 108 as buffer register 108(3) (FIG. 2A). In this embodiment, buffer register 108(2) includes N flip-flops 205(1)–205(N) connected serially. Data signal Data2, which is provided to flip-flop 205(1), is transferred to the next serially-connected flip-flop at an edge (generally the rising edge) of clock signal ShiftClk. Control register 118 (2), which corresponds to buffer register 108(2), also has N flip-flops 250(1)–250(N). The Q output terminals of flip-flops 215(1)–215(N) provide control signals 250(1)–250(N), respectively.

Thus, in accordance with one embodiment of the invention, both "short" and "long" registers can be provided in each register set. Short registers can be as short as 3 bits long and are preferably less than 6 bits long. Therefore, when clocked with a 80 MHz shift clock, the short registers can be loaded within 100 ns. In contrast, the long registers can be hundreds of bits long. The loading of buffer registers having different lengths poses unique issues as described below in detail.

Figure 3:
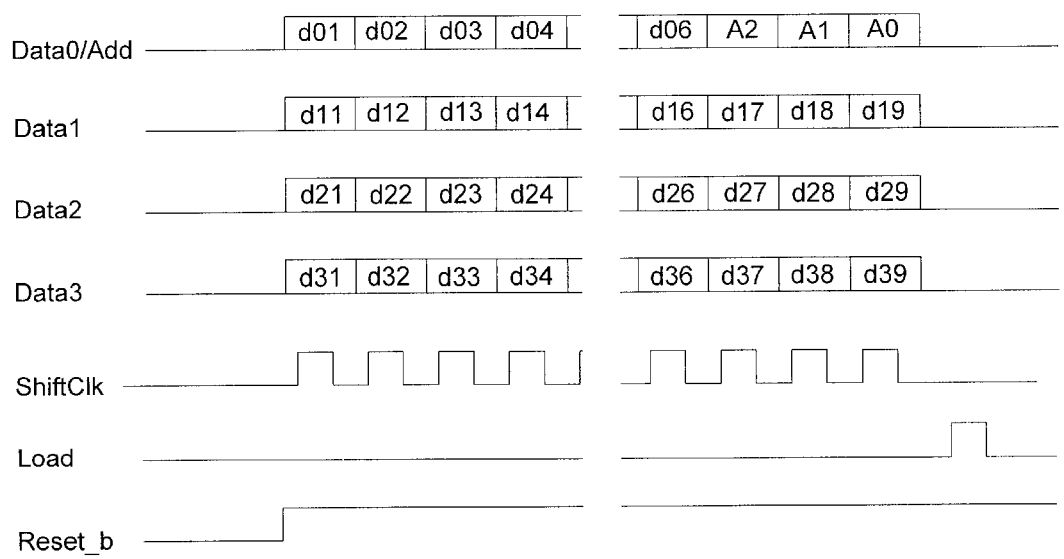
FIG. 3 illustrates a timing diagram for one exemplary data packet.

FIG. 3 illustrates a generic timing diagram for the loading of one data packet into a buffer register set and then into its corresponding control register set. Specifically, each data stream Data0–Data3 is loaded into a buffer register of the buffer register set with the clock signal ShiftClk. In accordance with one feature of the invention, a last predetermined number of bits of data stream Data0 designate the address of the control register set that will receive the loaded data packet. In the embodiment shown in FIG. 1, 8 control register sets are provided. Therefore, to uniquely address a control register set, 3 bits are needed. Referring back to FIG. 3, these address bits are shown as address bits A0–A2 in data stream Data0.

Receiving address bits A0–A2 indicates that all bits of the data packet have been loaded. At this point, a low-to-high transition of load signal Load transfers the data packet from the buffer registers into the appropriate control register as determined by address bits A0–A2. Note that a reset signal Reset_b, in this case an active low signal, can precede the loading of the data packet into the buffer registers and can asynchronously set all the flip-flop configuration bits to a predetermined state. In the timing diagram of FIG. 3, register bit 1 is the first bit shifted in. In other words, register bits d01, d11, d21, and d31 are the first bits shifted into the buffer registers receiving data streams Data0, Data1, Data2, and Data3, respectively.

Referring back to FIG. 1, note that data stream Data0 is initially provided to an address decoder 104, which can be implemented by three serially-connected flip-flops and other circuitry (not shown). Therefore, the loading of data stream Data0 is 3 bits behind the loading of data stream Data1–Data3. In accordance with one feature of the invention, the address bits A0–A2 are the last bits clocked into address decoder 104.

Using address bits A0–A3, address decoder 104 can generate the Load signal, which transfers the data packet loaded into buffer register sets 101–108 into the designated control register set. In other words, although all buffer register sets 101–108 receive the same data packet, only one of control register sets 111–118 will receive that data packet. Specifically, only one control register set actually receives the high-to-low transition of the Load signal. In this manner, the other control register sets retain their current stored values.

To ensure that address bits A0–A2 are provided at the end of loading the data streams, some manipulation of the data streams may be necessary. In one embodiment, a number of filler bits can be added to one or more data streams to ensure that the data streams, as loaded into the buffer registers, have an identical number of bits as the longest data stream.

The number of filler bits to be added, if necessary, can be determined when the design of the integrated circuit is complete. Specifically, each control register set 111–118 can control one or more functional block(s) within the integrated circuit. Thus, the number of bits to provide such control can be determined when the control register set is designed to be associated with a certain functional block (or group of functional blocks). Because the buffer register corresponding to its control register has an identical physical size, the number of filler bits can be calculated accordingly. Note that filler bits can precede the actual data/address bits provided in the data streams.

For example, assume data stream Data1 includes 100 data bits, data stream Data2 includes 50 data bits, data stream Data3 includes 2 data bits, and data stream Data0 includes only address bits A0–A3 and no data bits. In this example, additional "filler" bits can be provided in data streams Data0, Data2, and Data3. Specifically, 100 filler bits can be added to address bits A0–A3 (i.e. taking into account the 3 flip-flops provided by address decoder 104), 50 filler bits can be added to the data bits of data stream Data2, and 98 filler bits can be added to the data bits of data stream Data3.

Note that because the physical length of the buffer registers in the buffer register sets can vary, the loading of the exemplary data streams Data0–Data3 described above can result in some "overflow" conditions in some buffer registers during loading of the a data packet. For example, if control register set 111 is being loaded with the exemplary data streams described above, then the data streams loaded into buffer register sets 102–108 are essentially "don't care" values. In other words, if the physical length of all the buffer registers in buffer register set 102 is 50 (i.e. each buffer register being formed by 50 flip-flops serially connected), then when data streams Data0–Data3 are loaded into such buffer registers, only the last 50 bits (whether filler or data bits) of those data streams can be stored by buffer register set 102. However, because these values will not be loaded into control register set 112 (recall that only control register set ill is being loaded, called an active control register set), then the bits stored by buffer register set 102 are don't care values. Therefore, overflow conditions are acceptable in non-active buffer register sets, i.e. buffer register sets that will not result in loading of the active control register set.

In addition to configuration, the control signals can provide modifications to the functional blocks of the integrated circuit. For example, in one embodiment, the integrated circuit can implement a transceiver in a radio system. This transceiver can include register sets having 3 short registers banks (wherein a bank includes a buffer register and its associated control register), 3 long register banks, and one unassigned register bank. The first short register bank can control the I (inphase) and Q (quadrature) offset adjustment DACs (digital-to-analog converters) as well as the programmable gain calibration mode of the analog-digital chipset. The second short register bank can control the turbo mode (multi-channel communication) setting, RF (radio frequency) amplifier gain, IF (intermediate frequency) amplifier gains, baseband programmable gain amplifier gains, and receive/transmit (RX/TX) antenna control. Finally, the third short register bank can control the on/off states of the receive, transmit, power amplifier, synthesizer, and bias circuit blocks. Thus, by using the short register banks, control control interface 100 can allow the modification of dynamic parameters in the system implemented by the integrated circuit.

In this embodiment, the first long register bank can control the operating channel frequency by adjusting the frequency of the on-chip synthesizer. The second long register bank can control the configuration of the receive, transmit, sythesizer, and bias circuit blocks. Specifically, for each circuit block, the configuration bits can adjust its gain and bias current, tune its on-chip capacitors, and trigger a power down operation. In addition, the second long register bank can determine the status of digital inputs to on-chip state machines. The status can include, for example, initial conditions, override/bypass options, default settings for programmable registers, adjustable time constants, and adjustable gain settings.

Figure 4A:
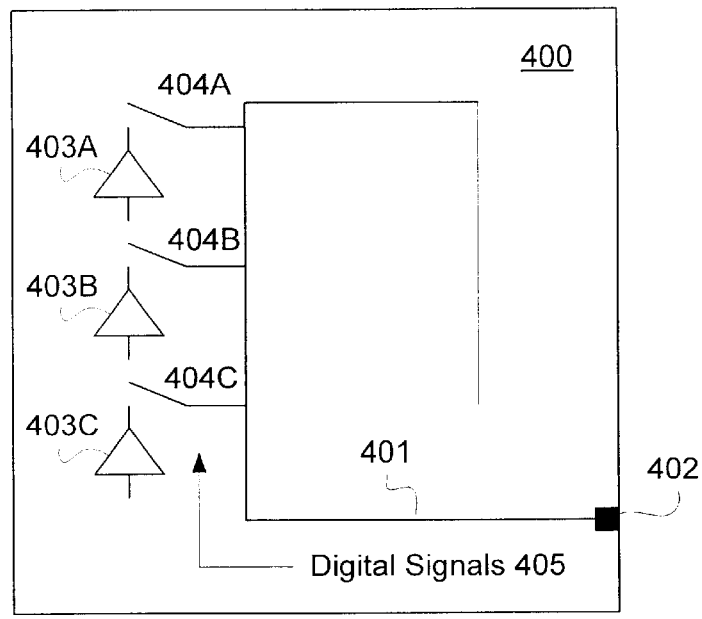
FIG. 4A illustrates one embodiment of a simplified chip configuration in which the control interface can selectively couple analog circuits to an input/output pin on the integrated circuit.

Finally, the second long register can connect analog nodes to an analog test bus. FIG. 4A illustrates one embodiment of a simplified chip configuration 400 including an analog line 401 connected to an analog pin 402. Note that analog line 401 can be distributed to various locations depending on the need for such a line in the integrated circuit. In this embodiment, the voltages provided by a plurality of analog circuits can be tested by selectively coupling those analog circuits to analog line 401. In FIG. 4A, amplifiers 403A–403C represent analog circuits implementing various functional blocks. A plurality of switches 404A–404C, controlled by the digital signals 405 stored by the second long register, allow the voltage associated with an amplifier 403 to be viewed at pin 402. Specifically, one switch 404 can be closed while the other switches are left open.

Figure 4B:
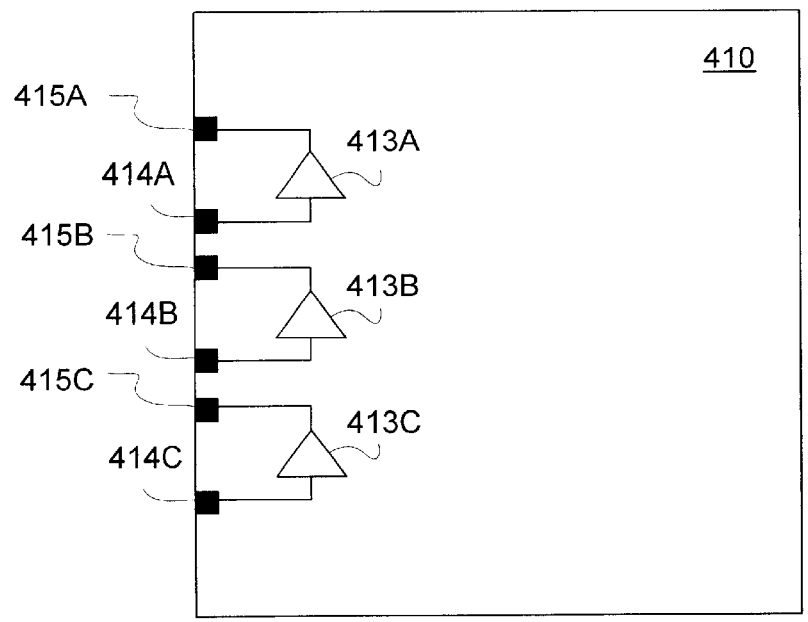
FIG. 4B illustrates a prior art chip configuration including a plurality of analog circuits coupled to a plurality of input and output pins on the integrated circuit.

In contrast, FIG. 4B illustrates a typical configuration 410 including a plurality of amplifiers 413A–413C. In this embodiment, amplifiers 413 have associated input pins 414 and output pins 415. Thus, by providing digital control over the analog components, control interface 100 can significantly reduce the number of required pins for monitoring analog components on the integrated circuit. In other embodiments, the voltages on one or more additional analog lines can be monitored in a similar manner.

In one embodiment, the third long register bank allows for an idle mode, wherein the entire integrated circuit can be put into an OFF mode for static current measurement. The third long register bank can control the output multiplexing of control interface 100 (FIG. 1). In this manner, the values stored by buffer register sets 101–108 and control register sets 111–118 can be observed via the Dataout pin during testing or normal operation of the integrated circuit. Thus, by using the long register banks, control interface 100 can allow the setting and calibration of static parameters in the system implemented by the integrated circuit.

Additionally, user data signals 106 can also be observed during testing and normal operation of the integrated circuit. For example, in a transceiver embodiment, user data signals 106 can include a Lock_Detect signal (indicating whether a phase locked loop (PLL) is locked), a divided_clk signal (indicating the divided down clock of the PLL), a PA_Out_reg signal (indicating a state machine output, which could control a power amplifier), and a Revision ID signal (indicating the revision associated with the integrated circuit).

In one embodiment, the content of the short register sets can be loaded from a companion digital chip on-the-fly at the beginning of each data packet. Long register sets can be used for programming static operating conditions within the integrated circuit. Therefore, in one embodiment, the long register sets can be loaded during initial power-on through software or firmware and remain unchanged during normal operation of the integrated circuit. The short and long register sets can be placed near the functional blocks being monitored, calibrated, or reconfigured, thereby minimizing the interconnect associated with these register sets. In one embodiment, only one flip-flop (e.g. the last flip-flop) of the register is connected to multiplexer 101. However, in other embodiments, multiple flip-flops from one or more registers can be connected to multiplexer 101, thereby increasing the testability and monitoring capability of interface 100.

Figure 5:
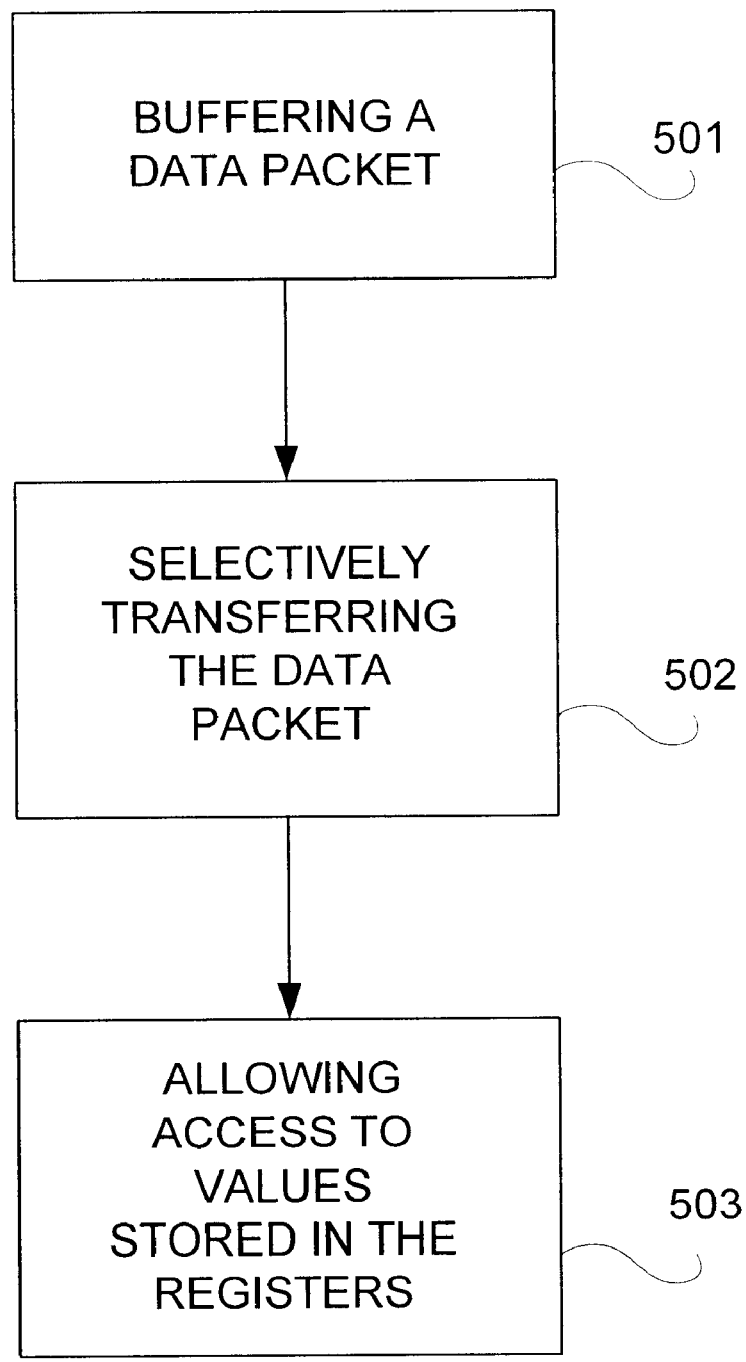
FIG. 5 illustrates a simplified flow chart of providing one embodiment of the control interface.

FIG. 5 illustrates a simplified flow chart of providing one embodiment of the control interface. In step 501, the data packet received by pins on the integrated circuit can be buffered. As shown in reference to FIG. 1, this buffering can be performed by a plurality of buffer register sets. In step 502, the data packet can be selectively transferred from one of the plurality of buffer register sets into a designated control register set. In a typical embodiment, the designated control register set can control a functional block on the integrated circuit. In step 503, the values of each buffer/control register in a set can be accessed.

In accordance with one feature of the invention, the buffer registers can have different lengths and buffering the data packet can include receiving data streams of different lengths. For example, the data packet can be from three to N bits in length, wherein N is an integer. In one embodiment, the length of at least one buffer register is different than its received data stream, thereby creating a data overflow condition. One data stream can include an address of the designated control register, wherein the address is appended at the end of the data packet. Therefore, step 502 can further include decoding the appended bits to identify the address of the designated control register set.

Figure 6:
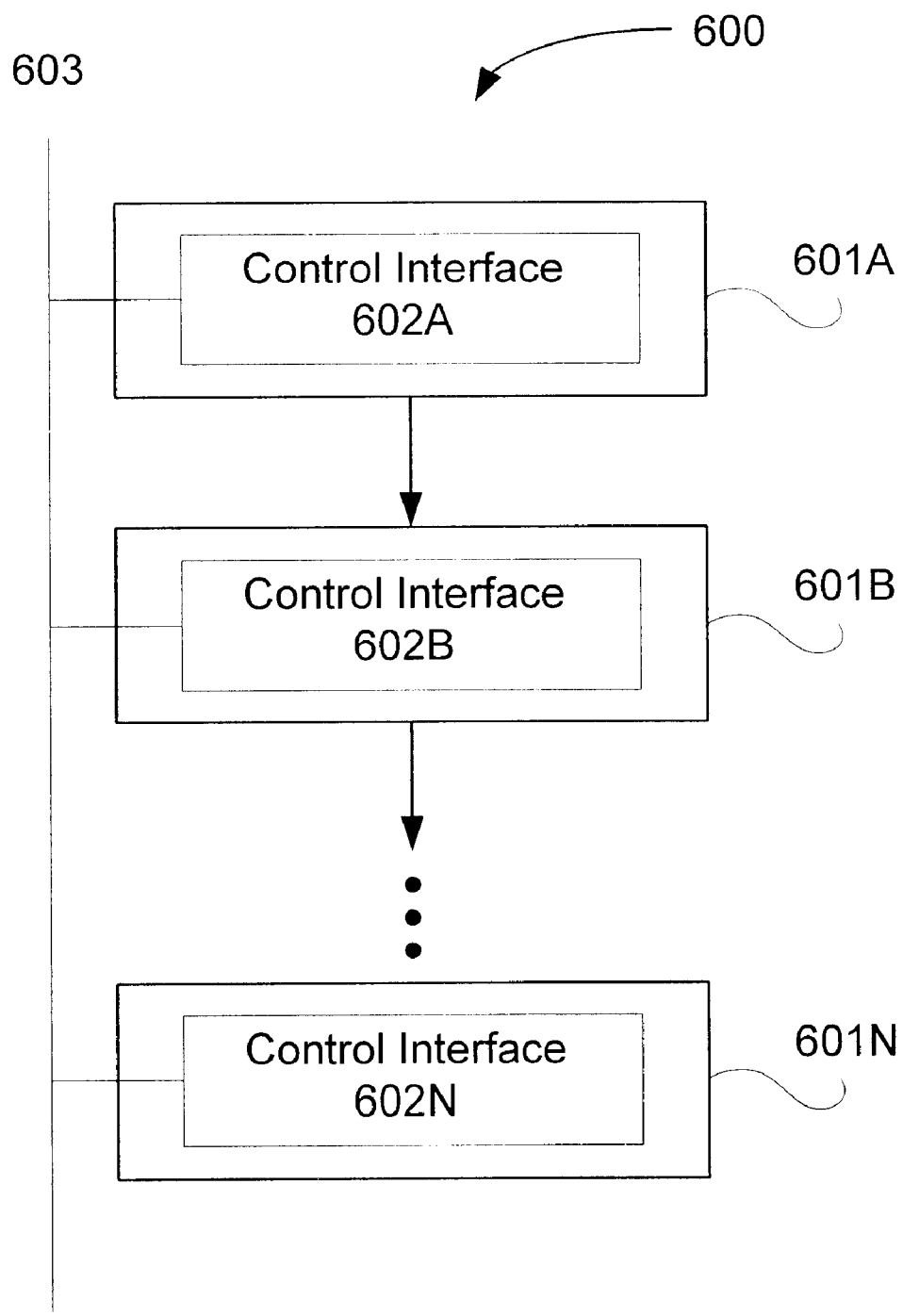
FIG. 6 illustrates a system in which the control interface provides a scalable architecture.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. For example, FIG. 6 illustrates a system 600 including a plurality of integrated circuits 601A–601N, each integrated circuit including a control interface 602. In this embodiment, integrated circuits 601 can receive identical input signals from a bus 603. These input signals can be buffered and monitored using control interfaces 602A–602N. Therefore, in accordance with one feature of the invention, the control interface advantageously allows a scalable system architecture. Note that a control interface can be sized and configured to include any number buffer/control register sets, receive any number of data streams or user data signals (or any signals provided on the integrated circuit), or access any number of signals stored by the buffer/control registers. Accordingly, it is intended that the scope of the invention be defined by the following Claims and their equivalents.

What is claimed is:

1. A control interface for an integrated circuit, the control interface comprising:
a plurality of buffer registers coupled to a plurality of data input pins of the integrated circuit, wherein each buffer register is coupled to a clock pin of the integrated circuit;
a plurality of control registers, wherein each control register is coupled to its associated buffer register, wherein each control register is coupled to a load pin of the integrated circuit, and wherein each control register is coupled in operative relation to a functional block on the integrated circuit; and
an address decoder coupled to one of the data input pins, the clock pin, and the load pin, wherein the address decoder determines which control registers are loaded with content of their associated buffer registers.

2. The control interface of claim 1, further including:
a multiplexer coupled to an output pin of the integrated circuit, wherein the plurality of buffer registers and the plurality of control registers provide signals to the multiplexer.

3. The control interface of claim 1, wherein the plurality of buffer registers have different lengths.

4. The control interface of claim 3, wherein the plurality of control registers have different lengths, and wherein each control register and as its associated buffer register have a same length.

5. The control interface of claim 1, wherein the integrated circuit implements a radio transceiver.

6. The control interface of claim 1, wherein the integrated circuit includes an analog line and a plurality of analog components, wherein at least some values provided by the plurality of control registers can selectively couple one of the plurality of analog components to the analog line.

7. The control interface of claim 1, wherein the integrated circuit includes N data input pins, wherein the plurality of buffer registers form M sets, each set including N buffer registers, and wherein a buffer register from each set is coupled to one of the N data input pins.

8. The control interface of claim 7, wherein the plurality of control registers form corresponding M sets, wherein the address decoder can decode an address designating 1 of M sets of control registers for loading.

9. The control interface of claim 1, wherein the plurality of buffer registers are further coupled to a reset pin of the integrated circuit.

10. The control interface of claim 1, wherein the control interface is scalable to a system with multiple integrated circuits.

11. The control interface of claim 1, wherein the functional block controls at least one of a dc offset of a receiver, a signal gain on the receiver, an operating mode of the receiver, a signal gain of a transmitter, an output power level of the transmitter, an operating mode of a transceiver, a channel of a synthesizer, a frequency of the synthesizer, a dc bias of an analog circuit, and a frequency band of operation.

12. The control interface of claim 11, wherein the operating mode of the receiver includes a transmit mode, a receive mode, or a standby mode.

13. The control interface of claim 11, wherein the operating mode of the receiver includes a turbo mode or a standard mode.

14. An integrated circuit comprising:
a plurality of functional blocks for performing various functions;
an analog line coupled to a pin of the integrated circuit;
a plurality of switches coupled to the analog line;
a plurality of analog components selectively coupled to the analog line via the plurality of switches; and
a control interface including:
a plurality of buffer registers coupled to input pins of the integrated circuit;
a plurality of control registers coupled to the plurality of buffer registers, wherein each control register is coupled to an associated buffer register, wherein each control register is coupled in operative relation to a functional block on the integrated circuit, and wherein at least one functional block controls the plurality of switches.

15. The integrated circuit of claim 14, wherein the input pins include at least one of a data input pin, a clock pin, and a reset pin.

16. The integrated circuit of claim 14, wherein the plurality of buffer registers have different lengths.

17. The integrated circuit of claim 14, wherein the plurality of control registers have different lengths, and wherein each control register and its associated buffer register have a same length.

18. The integrated circuit of claim 14, further including an address decoder operatively coupled to a set of buffer registers and the plurality of control registers, wherein the set of buffer registers is less than the plurality of buffer registers.

19. The integrated circuit of claim 14 implementing a transceiver, wherein each of a first set of buffer registers has a first length, wherein each of a second set of buffer registers has a second length, wherein the second length is longer than the first length, and each of the plurality of control registers has a length of its associated buffer register.

20. The integrated circuit of claim 19, wherein the first set of buffer registers loads dynamically adjustable control values.

21. The integrated circuit of claim 19, wherein the second set of buffer registers loads static configuration control values.

22. The integrated circuit of claim 14, wherein the control interface is scalable to a system with multiple integrated circuits.

23. The integrated circuit of claim 14, wherein the functional block controls at least one of a dc offset of a receiver, a signal gain on the receiver, an operating mode of the receiver, a signal gain of a transmitter, an output power level of the transmitter, an operating mode of a transceiver, a channel of a synthesizer, a frequency of the synthesizer, a dc bias of an analog circuit, and a frequency band of operation.

24. The integrated circuit of claim 23, wherein the operating mode of the receiver includes a transmit mode, a receive mode, or a standby mode.

25. The integrated circuit of claim 23, wherein the operating mode of the receiver includes a turbo mode or a standard mode.

26. The integrated circuit of claim 14, further including a multiplexer coupled to receive signals from the plurality of buffer registers and the plurality of control registers.

27. The integrated circuit of claim 26, wherein the multiplexer is configured to further receive at least one user data signal.

28. The integrated circuit of claim 26, wherein the multiplexer is coupled to an output pin of the integrated circuit.

29. A method of providing, an interface on an integrated circuit, the method comprising:

buffering a data packet comprising a plurality of data streams received by input pins on the integrated circuit, the buffering performed by a plurality of buffer register sets; and selectively transferring the data packet from one of the plurality of buffer register sets into a designated control register set, the designated control register set controlling at least one functional block on the integrated circuit, wherein one data stream includes an address of the designated control register set, and wherein the address is received at the end of the data packet.

30. The method of claim 29, wherein buffer registers of the plurality of buffer register sets can have different lengths, and wherein buffering the data packet includes receiving data streams of different lengths.

31. The method of claim 29, wherein the length of at least one buffer register is different than its received data stream, thereby creating a data overflow condition.

32. The method of claim 29, wherein the integrated circuit implements a transceiver, wherein the plurality of buffer register sets includes a first set of buffer registers having a first length and a second set of buffer registers having a second length, wherein the second length is longer than the first length, and each of the plurality of control registers has a length of its associated buffer register.

33. The method of claim 32, wherein the first set of buffer registers loads dynamically adjustable control values.

34. The method of claim 32, wherein the second set of buffer registers loads static configuration control values.

35. The method of claim 29, wherein the designated control register set controls selectively coupling an analog component to an output pin of the integrated circuit.

36. The method of claim 29, wherein the functional block controls at least one of a dc offset of a receiver, a signal gain on the receiver, an operating mode of the receiver, a signal gain of a transmitter, an output power level of the transmitter, an operating mode of a transceiver, a channel of a synthesizer, a frequency of the synthesizer, a dc bias of an analog circuit, and a frequency band of operation.

37. The method of claim 36, wherein the operating mode of the receiver includes a transmit mode, a receive mode, or a standby mode.

38. The method of claim 36, wherein the operating mode of the receiver includes a turbo mode or a standard mode.

39. The method of claim 29, further including allowing access to values of each register of the plurality of buffer register sets and of the plurality of control register sets.

40. The method of claim 29, further including scaling the control interface to a system with multiple integrated circuits.

41. A method of transfering data to an integrated circuit, the method comprising:

assessing the length of a data packet to be transferred, the data packet including a first bit and a last bit;

appending bits representing an address for the data packet after the last bit of the data packet;

transferring the data packet and the appended bits to the integrated circuit.

42. The method of claim 41, further including buffering the data packet.

43. The method of claim 42, further including:

decoding the appended bits to identify the address; and loading the data packet into a control register set identified by the address.

44. The method of claim 27, wherein the data packet comprises a plurality of data streams and each data stream is from three to N bits in length, wherein N is an integer.

45. A control interface for an integrated circuit, the control interface comprising:

a multiplexer coupled to an output pin of the integrated circuit;

a plurality of buffer registers coupled to provide signals to the multiplexer;

a plurality of control registers coupled to provide signals to the multiplexer, wherein each control register has an associated buffer register, wherein each control register can be loaded from its associated buffer register, and wherein each control register is coupled in operative relation to a functional block on the integrated circuit.

46. The control interface of claim 45, wherein the plurality of buffer registers are coupled to input pins of the integrated circuit.

47. The control interface of claim 45, wherein the multiplexer is configured to further receive at least one user data signal.

48. The control interface of claim 45, wherein the plurality of buffer registers have different lengths.

49. The control interface of claim 48, wherein the plurality of control registers have different lengths.

50. The control interface of claim 45, further including an address decoder operatively coupled to a set of buffer registers and the plurality of control registers, wherein the set of buffer registers is less than the plurality of buffer registers.

51. The control interface of claim 45 in a transceiver, wherein each of a first set of buffer registers has a first length, wherein each of a second set of buffer registers has a second length, wherein the second length is longer than the first length, and each of the plurality of control registers has a length of its associated buffer register.

* * * * *